United States Patent [19]

Gibbons et al.

[11] Patent Number: 5,331,567
[45] Date of Patent: Jul. 19, 1994

[54] PYRAMIDAL ABSORBER HAVING MULTIPLE BACKING LAYERS PROVIDING IMPROVED LOW FREQUENCY RESPONSE

[75] Inventors: Hugh T. Gibbons, Louisville; Edward F. Kuester, Boulder, both of Colo.

[73] Assignee: The University of Colorado Foundation, Inc., Boulder, Colo.

[21] Appl. No.: 748,577

[22] Filed: Aug. 22, 1991

[51] Int. Cl.$^5$ .............................................. G06F 15/60
[52] U.S. Cl. .................................. 364/481; 364/512; 364/578; 181/284; 73/865.6
[58] Field of Search .................. 364/481, 512, 578; 181/284; 73/865.6

[56] References Cited

U.S. PATENT DOCUMENTS

| | | | |
|---|---|---|---|
| 4,477,505 | 10/1984 | Warnaka | 428/160 |
| 4,864,315 | 9/1989 | Mohuchy | 343/703 |
| 4,931,798 | 6/1990 | Kogo | 342/4 |
| 4,972,191 | 11/1990 | Ishino et al. | 342/1 |
| 5,016,185 | 5/1991 | Kuester et al. | 364/481 |
| 5,134,405 | 7/1992 | Ishihara et al. | 342/1 |

Primary Examiner—Thomas G. Black
Assistant Examiner—Stephen J. Walder, Jr.
Attorney, Agent, or Firm—Francis A. Sirr; Earl C. Hancock

[57] ABSTRACT

Wall coverings for anechoic chambers are disclosed having an array of lossy pyramid cone material mounted on multiple backing layers of absorbing material. The number of backing layers to be used, their physical dimension (thickness) and their material properties (conductivity and permittivity) are selected so as not to modify the high frequency (UHF) behavior of the pyramid structure, while at the same time providing a greatly reduced low frequency (VHF) reflection coefficient for the composite absorbing wall. The physical dimension and the material properties of each of the multiple backing layers are selected by a constrained nonlinear optimization data processing procedure or method. The optimization method utilizes known S parameters of the pyramid array, and either known properties of the backing layers, or constrained backing layer properties that are defined by the wall designer. Optimization is achieved by mathematically sampling the wall's wave reflection at wave frequencies and wave incident angles that are defined by the designer. The output of the optimization method provides a wall design which minimizes wave reflection therefrom by defining the number of backing layers to be used, the thickness of each backing layer, the electrical conductivity of each backing layer, and the permittivity or dielectric constant of each backing layer.

6 Claims, 8 Drawing Sheets

$$P_1 \begin{cases} S_{11} = \dfrac{b_1}{a_1} \bigg|\; a_2 = 0 \quad (\text{REFLECTION OF } a_1) \\ S_{12} = \dfrac{b_2}{a_1} \bigg|\; a_2 = 0 \quad (\text{TRANSMISSION OF } a_1) \end{cases}$$

$$P_2 \begin{cases} S_{21} = \dfrac{b_1}{a_2} \bigg|\; a_1 = 0 \quad (\text{TRANSMISSION OF } a_2) \\ S_{22} = \dfrac{b_2}{a_2} \bigg|\; a_1 = 0 \quad (\text{REFLECTION OF } a_2) \end{cases}$$

OBJECTIVE FUNCTION $$F(X) = S \sqrt[K]{\frac{1}{N_\theta N_S} \sum_{i=1}^{N_\theta} \sum_{j=1}^{N_S} \left| \Gamma(X, \theta_i, S_j) \right|^K}$$

- $\Gamma$ = REFLECTION COEFFICIENT
- $S_j$ = FREQUENCY SAMPLING POINTS
- $\theta_i$ = ANGLE SAMPLING POINTS
- $S$ = ARBITRARY SCALE FACTOR — CAN BE + OR −
- $K$ = THE ORDER OR POWER OF THE NORM IN THE FUNCTION $F(x)$
- $X$ = LIST OF LAYER THICKNESSES
- $i, j$ = SUMMATION INDICES
- $N_\theta$ = NUMBER OF ANGLES SAMPLED
- $N_S$ = NUMBER OF FREQUENCIES SAMPLED

FIG. 6.

REAL PERMITTIVITY = $A_{2,i} + 100 A_{3,i} (f/30)^{A_{5,i}}$

IMAGINARY PERMITTIVITY = $-100 A_{3,i} A_{4,i} (f/30)^{A_{5,i}}$ $f$ = FREQUENCY IN MEGAHERTZ

FIG. 8A.

PYRAMIDAL ABSORBER HAVING MULTIPLE BACKING LAYERS PROVIDING IMPROVED LOW FREQUENCY RESPONSE

FIELD OF THE INVENTION

This invention relates to the field of anechoic measurement chambers, and more specifically to a method for selecting the physical dimensions and the material properties for multiple absorbing backing layers upon which an array of lossy pyramid cone material is mounted.

RELATED INVENTION

Commonly assigned U.S. Pat. No. 5,016,185, filed Mar. 24, 1989 and issued May 14, 1991, and entitled Electromagnetic Pyramidal Cone absorber with Improved Low Frequency Design, describes a Riccati equation that governs the coefficient of reflection of an absorbing layer. A computer program iteratively solves this equation to obtain a minimum coefficient of reflection for an array of absorbing cones or pyramids. This patent is incorporated herein by reference.

BACKGROUND OF THE INVENTION

The present invention relates to anechoic chambers of the type that are used to measure radiation that is emitted by electrical equipment and the like. The Federal Communications Commission (FCC) imposes limits on the amount of radiation that can be emitted by certain classes of such equipment sold in the United States. As a result, equipment must be tested to insure compliance with these FCC requirements.

Testing of such equipment must be performed over an exemplary frequency range of from a low frequency of 30 megahertz (MHz) to a high frequency of 1000 MHz in an open field environment, i.e. in an environment that is essentially free of radiation reflection and of ambient electromagnetic fields. In most cases, an open field environment is not available. As a result, tests are usually conducted in a closed anechoic chamber that is constructed and arranged to provide a quasi-open-field environment that is essentially free of radiation reflection and of ambient electromagnetic fields.

Anechoic chamber walls are conventionally lined with a material that absorbs electromagnetic wave energy, much as black paint operates to absorb light. U.S. Pat. No. 4,477,505 provides an example. The wavelength of light is quite small as compared to the wavelength of radiation in the 30 to 1000 MHz range. In general, anechoic chamber absorber material must be at least ¼ wavelength thick for appreciable wave absorption to take place. Since wavelength is inversely proportional to frequency, the effective thickness of an absorber must increase as the frequency in question decreases.

Ordinarily, in an anechoic chamber a single backing layer of homogeneous material underlies the array of pyramid cone absorbers. This backing material is typically identical to the pyramid material. This backing layer is mounted onto the chamber's metal wall, which wall operates to shield the chamber from external radiation.

Known anechoic chambers using pyramidal absorbers provide excellent broad band suppression of reflected waves in the high frequency region. Very low reflection occurs from the pyramidal absorbers at high frequencies since incident wave energy is reflected several times from the flat surfaces of the cones before finally being reflected back into free space. A fraction of the high frequency incident wave is absorbed at each one of these reflections or bounces. Thus, high frequency waves are very much diminished in strength or magnitude by the time they reflect from the array of pyramidal absorbers into free space.

This physical picture of absorption at high frequencies in valid because the wavelengths involved are relatively small in comparison to the physical size of the pyramidal absorbing structures. As a result, quasi optical reflections occur.

At low frequencies, however, the wavelength becomes much longer than the spacing between adjacent pyramidal absorbers. The depth of penetration of the electromagnetic wave ("skin depth") in the absorbing material likewise becomes long compared to the size of the pyramids. For such a pyramid structure, reflection at low frequencies cannot be modeled in terms of successive reflections from individual surfaces of the cones. Instead, it is more natural to consider an array of pyramids as an equivalent layer of material with a flat surface located in the X-Y plane.

Thus, at low frequencies, pyramidal absorbers can be simulated to some extent by layering a number of flat sheets of absorbing material, each layer having a slightly different permittivity and conductivity factors. Such an absorber is also called a gradient absorber. The greater the number of sheet layers, the more broad band will be the absorbing layer. Since cost must be considered, the number of flat sheets is generally limited to 5 or 6 sheets at the most, and most layered resonant material absorbers are made up of 3 layers. (MICROWAVES, December 1969, an article entitled "Microwave Absorbing Materials and Anechoic Chambers—Part 1", beginning at page 38). On the other hand, such flat layered absorbers are far inferior to actual pyramid absorbers at high frequencies.

Low frequency electromagnetic waves propagate into and are absorbed by the array of pyramids just as they would be by any other material, with the exception that some of the incident radiation is scattered at angles other than that which is prescribed by Snell's law. Dominating such reflection is a pair of waves, i.e. the scattered and reflected waves, that propagate at the Snell reflection angles. The strengths or magnitudes of the scattered and reflected waves are determined by certain effective material characteristics of the above mentioned equivalent layer. For typical pyramid absorbers, the reflection coefficients for an array of such absorbers mounted on a metallic backing wall are quite large, tending toward unity at the low frequency limit. This makes pyramid absorbers of limited usefulness in anechoic chambers to be used at these lower frequencies.

The need for a low frequency chamber, however, is growing. Modern computing devices may emit in this spectrum, and compliance with FCC regulations requires that products be tested to prevent interference with communications. For example, in order to certify an anechoic chamber for such testing, the FCC requires that the fields within the chamber be within 4 dB of open field test conditions from 30 MHz to 300 MHz (the VHF band). While this requirement may not seem overly strict, it is somewhat difficult to satisfy, especially if the same anechoic chamber is also to be used at higher frequencies.

At lower frequencies, it is possible to achieve low reflection coefficients using a single layer dispersive absorber. Such absorbers can work well in a narrow range of frequencies, but because the dispersion of the absorbing material is not completely controllable, the bandwidth of these absorbers is narrow.

As mentioned above, one prior art approach to designing anechoic chambers has been the use of multilayer absorbers in the absence of pyramidal absorbers. These multilayer absorbers are built to minimize reflection in a specified range of frequencies. Prior to the present invention the design of multilayer absorbers required the use of interactive cut-and-try methods, Smith-chart methods, and numerical optimization techniques. In these designs, the layers are usually composed of homogeneous materials. This limitation narrows the achievable bandwidth for absorbers of a given size. A top layer continuously matched to the external medium has been shown to produce the best high frequency performance.

While anechoic chambers, and the methods by which such chambers have been designed, have been generally satisfactory in the art, the need remains to provide a means whereby the low frequency response of such chambers can be still further improved.

SUMMARY OF THE INVENTION

The present invention relates to anechoic chambers of the type that are used to measure electromagnetic radiation emitted by electrical equipment, electronic equipment and the like. More specifically, this invention relates to a method for optimizing the low frequency design of multiple absorbing layers, i.e. backing layers, upon which an array of pyramid cone absorbers are mounted. The method of the invention models and optimizes the low frequency properties of the absorber backing layers as an aid in designing the chamber's overall absorbing wall structure. As used herein, the term low frequency is intended to mean electromagnetic waves in the range of from about 30 megahertz to about 200 megahertz.

As used herein, the term pyramid cone structure is intended to mean any three dimensional geometric shape of an electromagnetic absorbing material, or materials, having a relatively large size or area, a base portion and a relatively smaller size apex portion that is continuously tapered from the base portion.

An understanding of electromagnetic wave absorbing materials and their use in anechoic chambers may be had with reference to the article entitled *Understanding Microwave Absorbing Materials and Anechoic Chambers*, Parts 1–4, Microwaves, Vol. 8, No. 12, and Vol. 9, Nos. 1, 4, and 5 (December 1969, and January, April and May 1970), incorporated herein by reference.

In accordance with the present invention, the physical dimensions and the material properties of the multiple absorbing backing layers of an anechoic chamber are selected so as leave the high frequency behavior of the chamber's pyramid cone structure unchanged, and yet the multiple backing layers greatly reduce the low frequency reflection coefficient of the chamber's absorbing wall. The physical dimensions and the material properties for the multiple backing layers are selected by a procedure of constrained optimization.

The method of the invention finds the best possible absorber wall design, subject to the constraints and specifications that are supplied by the wall designer. A first such constraint is the S parameters of the wall's pyramid cone array (see FIG. 5), expressed at the various frequences and angles of wave incidence that are considered important to the wall designer. These S parameters are calculated by the method described in above mentioned U.S. Pat. No. 5,016,185.

An object of the present invention is to provide a constrained optimization technique and method for selecting the physical dimensions and the material properties for multiple absorbing backing layers upon which an array of lossy pyramid cone material is mounted.

The present invention operates to replace prior art single and multiple layer backing material with multiple backing layers, wherein the physical dimensions and the material properties of the multiple backing layers are selected by a method of constrained optimization that takes into account the fixed S parameters of the pyramid array, and that lets the physical and material characteristics of the backing layers vary within predefined limits or constraints, as the optimum backing layer construction is determined.

The present invention combines the advantages of multilayer backing absorbers with those of pyramid absorbers. This general structure is shown in FIG. 1.

In a wall structure in accordance with this invention the effective wall material properties match continuously to the external air medium. As a result, good absorbing performance is provided in the range of frequencies between a design frequency and the microwave region, where quasi optical techniques are applicable. An advantage of this approach, with reference to FIG. 1, is that higher frequency waves do not penetrate into backing layers 10, located behind pyramids 11, due to their short wavelengths and penetration depths. As a result, microwave performance of the FIG. 1 absorbing wall is generally equal to that of pyramid absorbers originally designed for microwaves. In accordance with the invention the backing layers 10 of FIG. 1 are adjusted to minimize the reflection that occurs from the absorbing wall at the lower frequencies.

In accordance with the invention, the S parameters of pyramid absorbers 11 are known, and are of a fixed value. The fixed reflection and transmission properties (i.e. the S parameters) of pyramid absorbers 11 are used in the method of the invention to determine the backing layer 10 design that minimizes the overall wave reflection from the absorbing wall structure.

In a preferred embodiment of the invention, this adjustment procedure may comprise, (a) utilizing the method of above mentioned U.S. Pat. No. 5,016,185 to optimize the construction and arrangement of pyramid absorbers 11, and to compute the reflection and transmission properties (i.e. the S parameters) of pyramid absorbers 11, and then (b) determining the design of the backing layer(s) 10 that minimizes the overall reflection from the wall structure.

Calculating the average reflection and transmission properties of a three dimensional inhomogeneous medium such as pyramid cones 11 is not a trivial task. However, since ordinary absorbing pyramids are two dimensionally periodic, it is feasible to compute their average or "effective" conductivity, (and permeability, if necessary) accurately with respect to fields which vary slowly with distance as compared to the spacing of pyramids 11 themselves. The technique for doing this is known as homogenization. Once the averaged material properties are computed, they may be looked up as needed, and used to solve for the S parameters that characterize the reflection and transmission of plane waves by the pyramid array.

Reflection from the overall structure can then be calculated from (1) the S parameters of pyramids 11, and (2) the reflection properties of backing layers 10. The material properties of backing layers 10 may be fixed, or they may be free to vary within certain practical bounds or constraints, as defined by the wall designer. The size and the composition of backing layers 10 are controlled by a set of variables and constraints which comprise a mathematical problem space, defined as a mathematical subspace of $R^N$, where N is the total number of designer specified variables that are used to specify the composition of backing layers 10.

The method of the invention uses a mathematical "objective" function (shown in FIG. 6) which appropriately weights the magnitudes of the reflections at a variety of frequency sampling points and at a variety of angle of wave incidence sampling points. By way of this objective function, a constrained optimization is performed on the material variables that are defined for layers 10 by the wall designer. The resulting output from the method of the invention represents the best possible physical design for backing layers 10, within the given material constraints.

These and other objects and advantages of the invention will be apparent from the following detailed description of the invention, which description makes reference to the drawing.

DETAILED DESCRIPTION OF THE INVENTION

This invention relates to absorbing wall coverings for anechoic chambers having an array of pyramid cones mounted on multiple backing layers of absorbing material, and more specifically to a method for optimizing the construction of the backing layers so as to not modify the high frequency reflection behavior of the pyramid array, while at the same time providing greatly reduced low frequency reflection from the composite absorbing wall.

Figure 1:
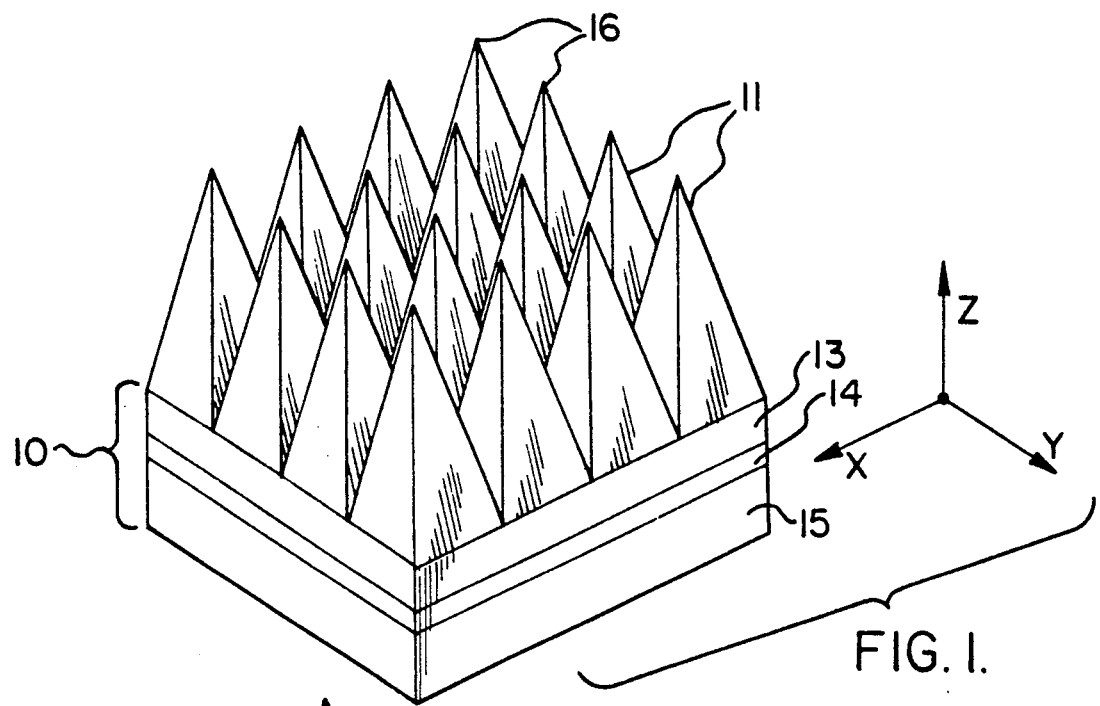
FIG. 1 is a perspective view of a portion of an anechoic chamber wall in accordance with the invention.

FIG. 1 is a perspective view of a portion of an anechoic chamber wall covering having an X-Y array of pyramid absorbers 11 that taper upward in the Z direction. Pyramid absorbers 11 are mounted on a backing layer construction 10 that comprises three individual backing layers 13-15 whose Z direction thickness and material properties are selected, in accordance with the invention, so as not to modify the UHF behavior of pyramid absorbers 11, while at the same time providing a greatly reduced VHF (i.e. low frequency) reflection coefficient for the composite wall covering comprising pyramids 11 and backing layers 10.

Backing layer 15 is mounted directly on the metal wall (not shown) of the anechoic chamber. Both pyramids 11 and layers 10 preferably comprise a non magnetic, electrically conducting foam material, for example a plastic urethane foam, whose pore size is unimportant, that contains graphite dust, and perhaps fire retardants and other dopants.

In the construction and arrangement of FIG. I, pyramid absorbers or cones 11 are important to the overall operation of the absorbing wall since a significant amount of the incident electromagnetic waves is absorbed in the pyramid section of the wall structure. High frequency waves do not appreciably reach or penetrate to backing layers 10, so nearly all of the absorption takes place in the cones. Less absorption takes place in the cones at low frequencies. Nevertheless the cones remain important to the overall performance of the structure in this case as well.

Pyramids 11 provide an effective wave impedance match between that of the air space and backing layers 10. If the impedance transition that exists between air and pyramids 11 is too abrupt, the waves will reflect from pyramids 11, and the waves will not penetrate far enough into structure 11,10 to be absorbed thereby. As a result, pyramids 11 should be sufficiently long in the Z direction to provide a reasonably smooth impedance transition from air to backing layers 10, and should by themselves exhibit reasonably good UHF absorption characteristics.

Above mentioned commonly assigned U.S. Pat. No. 5,016,185 describes a method whereby the low frequency design of pyramid absorbers such as 11 of FIG. 1 are optimized. More specifically, this patent describes a Riccati equation that governs the coefficient of reflection of an absorbing layer equivalent to the array of pyramid absorbers, and also describes an analysis program (see FIG. 8 thereof) that enables parameters of this equivalent absorbing layer to be computed.

In an exemplary arrangement, and without limitation thereto, each of the pyramids 11 has a generally 2×2 foot square X-Y dimension base, and cones 11 are of about a 6 feet Z height. Backing layer 10 is about 2 feet in total thickness.

Figure 2:
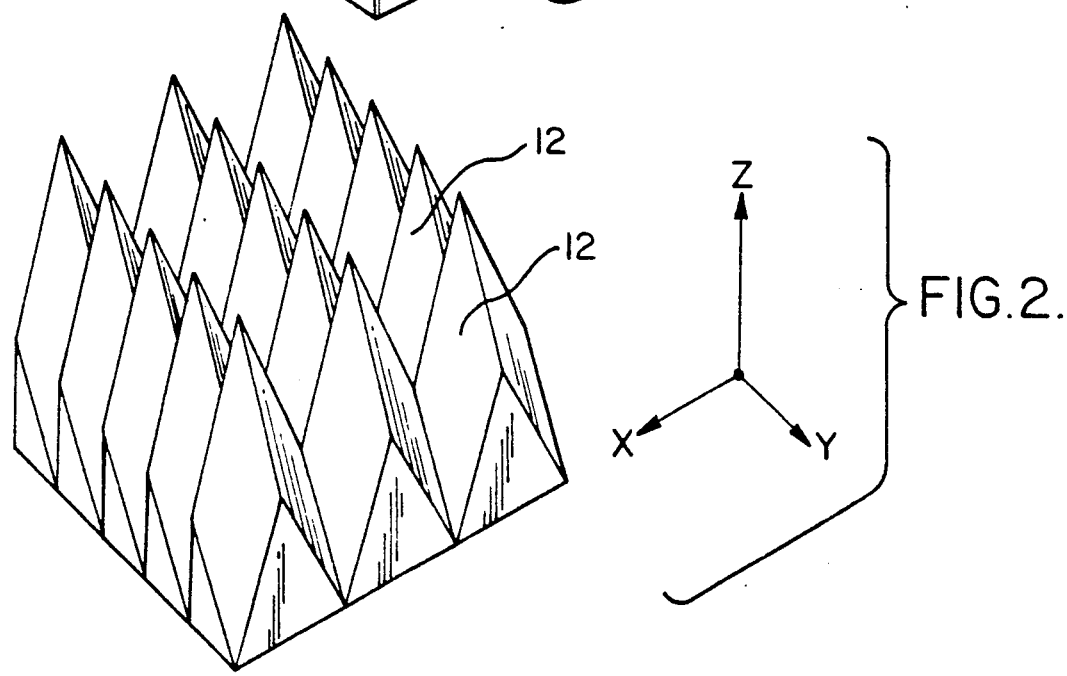
FIG. 2 is a perspective view of an array of pyramids that are rotated or twisted about 45 degrees relative to the Z direction of the array.

Two types of pyramid absorber geometry with which the invention finds utility, but without limitation thereto, are the rectangular or square pyramids of FIG. 1 in which adjacent pyramids 11 have bases which abut one another, and the twisted pyramids of FIG. 2 in which the pyramids are rotated 45 degrees with respect to the pyramid array. These two general types of pyramids have different effective permittivity and conductivity profiles, which property may render one type more useful than the other for a given specific purpose. While the dimensions of pyramids 11 as measured in the X-Y plane are relatively unimportant to the analysis of wave propagation, these X-Y dimensions should be significantly smaller than the wavelengths under consideration, and must be smaller than half the Z direction dimension of pyramids 11.

The array of pyramid absorbers 11 constitutes an absorbing structure that is periodic and discontinuous in the X-Y plane. At frequencies for which the physical period of absorbers 11 is small as compared to the wavelength and skin depth, the electromagnetic fields can be considered quasi-static within a single period (i.e. cone). The material from which pyramids 11 are made therefore has average or effective properties that govern the large scale variation of the fields. Effectively, the inhomogeneity of pyramids 11 in the X and Y directions can be averaged out, thus converting the actual pyramid medium to a one-dimensionally, inhomogeneous, anisotropic, lossy dielectric medium. The permittivity and the conductivity of this equivalent medium are intermediate to those of the pyramid material itself and of air.

Figure 4:
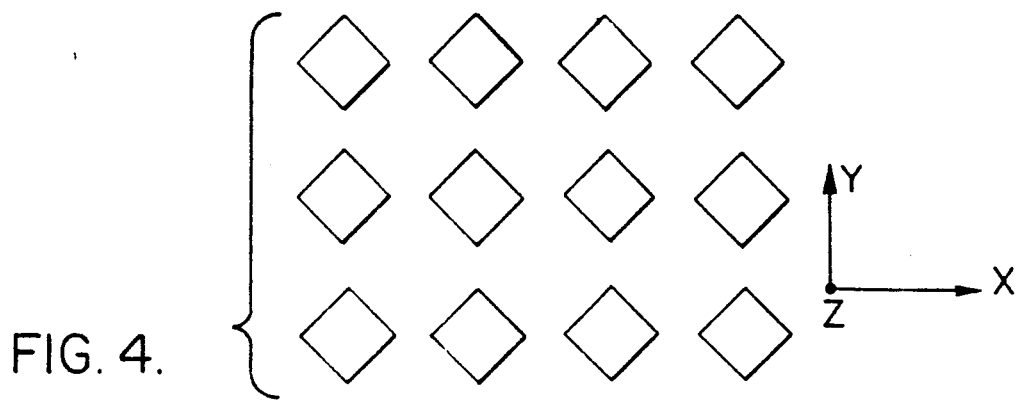
FIGS. 3 and 4 show thin transverse sections of the pyramids of FIGS. I and 2, respectively.
Figure 3:
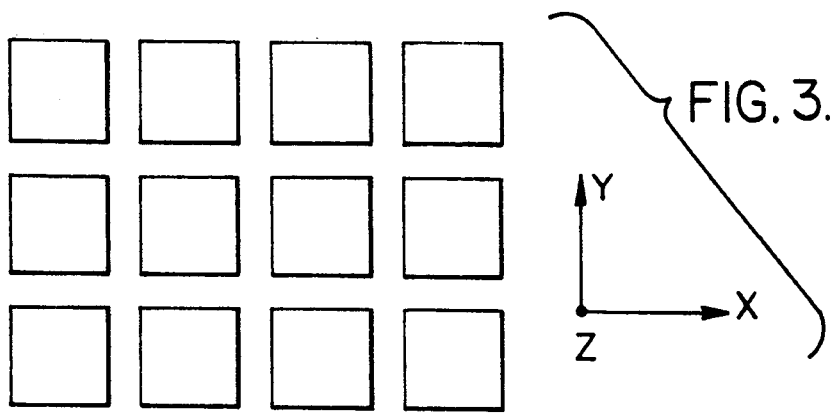

The permittivity and the conductivity of pyramidal absorbers 11 vary as a function of the distance Z from pyramid tips 16 to the base of the pyramids. In order to find the value of these properties at a fixed Z distance, a transverse section of pyramids 11, such as is shown in FIGS. 3 and 4, are considered. The pyramid media exhibits 4-fold symmetry about the Z axis, indicating that the average conductivity and average permeability are scalar in the X-Y plane within such a section.

As is well known by those skilled in the art, the permittivity of a material determines the speed or velocity with which an incident electromagnetic wave will travel through a nonmagnetic absorbing material, as well as the impedance of this wave. The conductivity property of the material is a measure of the damping that occurs to an electromagnetic wave as the wave passes through the material. Generally speaking, the conductivity and permittivity must not be so large as to result in a wave impedance greatly different from that in air, and thus to cause the wave to be largely reflected from the material, that is, the material must allow the wave to enter it without much reflection, so that the wave can thereafter be absorbed by the material's conductive property.

Electromagnetic waves that are incident on the tips 16 of the FIG. 1 array at any given angle measured from the Z axis may be resolved into two orthogonal polarizations, i.e. an electric polarization whose electric field is perpendicular to the Z axis, and a magnetic polarization whose magnetic field is parallel to the Z axis.

Once the equivalent material properties of the pyramid medium in FIGS. 1 and 2 are known, the average plane wave reflection and transmission properties of the array of pyramid absorbers are calculated. These properties are expressed via the S parameters, which are calculated using the well known Riccati equation, which equation is amenable to solution on a computer using a standard simultaneous differential equation solver.

Figure 5:
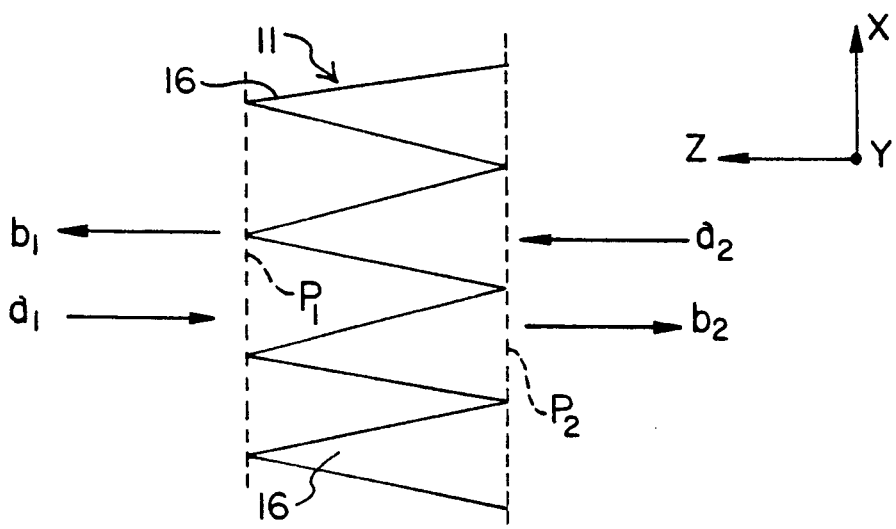
FIG. 5 is a side view of the array of pyramid cones shown in FIGS. 1 or 4, wherein the array's S parameters are shown in terms of the electromagnetic wave reflection and transmission that occurs at the two physical planes or ports P1 and P2 of the array, P1 being located at the plane containing the tips of the array, and P2 being located at the plane containing the base of the array, FIG. 6 discloses the mathematical optimization function, or objective function, that is minimized in a preferred embodiment of the invention.

As shown in FIG. 5, the S parameters of pyramid array 11 comprise a measure of the wave reflectance and the wave transmission properties of the array located between the P1 plane that contains pyramid peaks 16 and the P2 plane that contains the base of the array. For the purpose of this invention, it will be assumed that the S parameters of pyramid array 11 are of fixed and known magnitude, for example as obtained by actual measurement thereof, or by operation of the above described commonly assigned patent.

The present invention operates to vary the physical dimensions and the material properties of backing and absorbing layers 13-15 that are located behind pyramid absorber array 11, while holding the S parameter wave properties of the pyramid absorbers constant. It is necessary that the transmission and reflection properties of pyramid absorbers 11 be found in advance of the optimization procedure (preferably expressed as S parameters), as described above, rather than requiring the solution of the Riccati equation every time a new reflection is computed during the constrained optimization method of the invention.

Neglecting electromagnetic waves that are scattered by pyramid cones 11 at other angles (i.e. neglecting first and second order effects), the layer of pyramid cones 11 at any given angle of wave incidence is equivalent to a two port network. This is represented in FIG. 5, wherein port 1 (P1) is located at the plane of pyramid tips 16, and port 2 (P2) is located at the plane of the pyramid bases.

Backing layers 13-15, taken together, constitute another one port network having a reflection coefficient $r_b$ (herein called the backing reflection coefficient). In the presence of backing layers 13-15, the total reflection r from P1 can be calculated for any backing reflection coefficient. In this expression for the total reflection from P1 transmission parameters $S_{12}$ and $S_{21}$ always occur as a product. Therefore it is unnecessary to know the values of these two individual S parameters. Knowing the product thereof is sufficient. As a result, at any given angle of incidence and at any given frequency for the incident wave $a_1, a_2$, only three case need be considered in order to arrive at enough equations to extract the value of this product from the computed information.

These three equations are obtained by setting the value of $r_b$ (i.e. the backing reflection coefficient) to some value, and then numerically integrating the Riccati equation from the bases of the pyramid cones (i.e. from port 2) to the tips (i.e. port 1) in order to find the reflection coefficient r for the combination of the pyramids and the backing layers. Repeating this procedure with three different selected backing reflection coefficient values provides the three required equations which are then solved for the S parameter values.

The three different values that are chosen for the backing reflection coefficient need not be realizable values. It is only necessary that they be three different values, so as to provide three independent equations. For example, and for simplicity, choose the values of $r_b$ as "0" corresponding to an exact match in reflection between P2 and backing layers 13-15, as "−1" for a perfectly conducting or short circuit termination wall, and as "1" for a magnetic conductor or open circuit termination wall.

While general mathematical optimization processes are well known to those of skill in the art, and while a number of such constrained optimization methods may have utility in the invention, in a preferred embodiment of the invention the mathematical function that is to be minimized or optimized is as shown in FIG. 6. This function computes norms of an absorbing layer's reflection coefficient.

The function of FIG. 6 is minimized numerically by a subroutine known generally as a variable scale optimizer which finds a Kuhn-Tucker point, subject to upper and lower bounds on the variables thereof, and subject to general linear and nonlinear constraints. This type of constrained optimization subroutine may be the optimizer known as E04UCF, provided by the Numerical Analysis Group (NAG) library of Fortran subroutines. A very similar program is described in *User's Guide to LSSOL, Version* 1.0, Dept. of Operations Research, Stanford University, Report SOL 86-1, 1986.

In the optimizer referred to above, constrained nonlinear optimization comprises a technique for searching out the minima of a nonlinear function of a number of variables. Generally, optimization proceeds by (1) finding a search direction or vector along which the function F(x) is decreasing, (2) moving a distance along this search vector, and (3) returning to (1). The optimization process terminates when a minimum condition is found.

An important feature of the invention is that the optimization process or method includes user defined constraints. For example, the overall thickness of composite backing layer 10 of FIG. 1 cannot be too large, nor can it be of a negative value. Also, the materials from which these layers can actually be made have practical upper and lower limits of permittivity. The optimization method of the invention thus allows the wall designer to place bounds and a linear length constraint on the optimization function variables of the function F(x).

It is suggested that the optimization function that is selected in accordance with the spirit and scope of this invention be a smooth, single valued function, that takes advantage of smoothness to speed convergence and estimation of the closeness to a minimization solution of the function as the minimization process proceeds. For example, in the following description, the parameter called "norm order" K is not very large.

In above described step (1), the finding of a search vector, assumes that the optimization function F(x) is in a constrained quadratic form. A search is then conducted within the constraints to find a search vector along which function F(x) approaches a minimum. Once the search vector is found, the method computes a step size which yields a sufficient decrease in the function.

The scale factor "s" of this function is an arbitrary factor that allows the user to scale the overall size of the objective function. This affects the function's rate of convergence, and the direction of the search as minimization proceeds. By using a negative scale factor "s" the layer 10 construction that will produce the highest wave reflection conditions can be found, as well as the layer construction that will produce the lowest reflection conditions.

The function's order or power "K" provides a means for controlling trade-offs between wave reflections at the function's various sampling points. Generally, the peak wave reflections are the ones that cause the most trouble in an anechoic chamber. By choosing an order of "K"=2, making K(x) the RMS (root-mean-square), the user attempts to get the lowest overall wave reflection, perhaps at the expense of an occasional high peak reflection at a sampling point. Choosing a higher order "K" will reduce the possibility of a high peak reflection occurring, but perhaps at the expense of allowing an overall higher non peak wave reflection to occur from the wall. Suggested values for "K" are 2, 10 and 20. Use of an order "K" that is higher than 20 is not recommended because the objective function of FIG. 6 then appears to the optimizer routine to contain discontinuities which disrupt the minimization process.

The method of the present invention requires that the wall designer specify certain parameters or constraints of the mathematical function that is to be minimized, for example the function shown in FIG. 6.

For instance, in a given anechoic chamber it may be desirable to provide several types of absorber pyramids that are designed to minimize wave reflection at certain angles of incidence, and at different locations on the chamber wall. For this reason, whatever mathematical function is utilized in the practice of the invention, it is desirable that the mathematical function allow the designer to specify wave incident angles. Similarly, it may be that certain wave frequencies are of particular interest to the designer, in which case, the mathematical function should be selected to allow frequency sampling points to be specified by the wall designer.

Without limitation thereto, FIG. 6 shows such an exemplary mathematical function, herein called the objective function. The mathematical function of FIG. 6 is an Kth order norm of the vector of specified sample reflections from a composite absorber wall such as is shown in FIG. 1.

Figure 7:
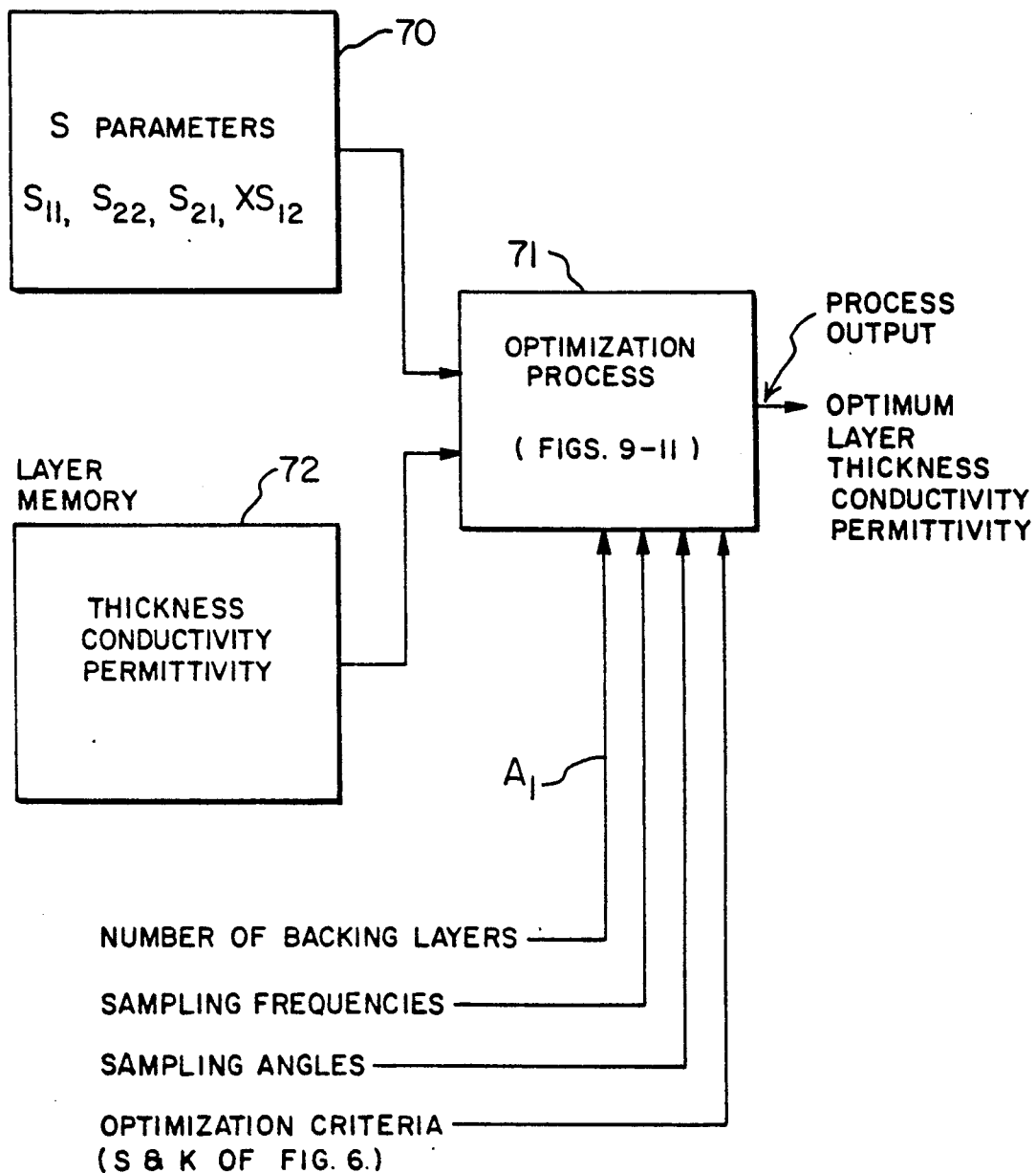
FIG. 7 shows the method of the invention in block diagram form, showing a pyramid memory that contains the S parameters of the pyramid array of FIG. 1, and showing a layer memory that contains user defined parameters and/or constraints for the backing layer of FIG. 1, FIG. 8A provides two exemplary formulas for describing the frequency dependence of the real permittivity and the imaginary permittivity, respectively, of each backing layer of FIG. 1, as this complex permittivity is expressed by the user defined variables A2-A5.

The method of the invention, generally shown in FIG. 7, requires that the S parameters of pyramid array 11 be known, and that these parameters be stored in a memory location 70, available for access by optimization/minimization process block 71 during minimization of the FIG. 6 objective function.

In addition, when layers 10 of FIG. 1 comprise predefined materials, the fixed value wave dispersion characteristics of these materials, for example the fixed permittivity value, must also be available in a memory location 72, for use during minimization of the FIG. 6 objective function, as effected by block 71.

In the alternative, the wave dispersion characteristics of layers 10 can be generally defined by the designer, and stored in memory location 72, without reference to any specific material, such definition including upper and lower limits or constraints within which the dispersion characteristics may be allowed to vary during the minimization process or method.

More specifically, and with reference to the exemplary objective function of FIG. 6, each of the individual layers within composite layer 10 is specified in terms of five variables for each layer, namely variables A1, A2, A3, A4 and A5. Variable A1 is the thickness of the layer, expressed in meters. In layers 10 in which the wall designer elects to allow the layer characteristics to vary within specified limits, the complex permittivity of the various layers is specified in terms of A2–A5, as is shown by the two formula of FIG. 8A.

Generally speaking, the variable A2 represents the limiting value of the layer's permittivity as the frequency of the incident wave increases; the variable A3 represents the magnitude of the frequency dependent component of the layer's permittivity, and is roughly proportional to the density of any dopants in the layer material; the variable A4 is a proportionality relationship between the layer's real and imaginary permittivity, and is generally determined by the chemicals that are used to manufacture the layer; and the variable A5 determines the rate of rolloff of the conductivity of the material with increasing incident wave frequency, and is also generally dependent upon the chemicals that are used to manufacture the layer.

In accordance with a feature of the invention the values of variables A1–A5 are subject to constraints in order to prevent then from taking on unrealistic values that do not model ordinarily available absorber materials. Exemplary constraint values, without limitation thereto, are as follows; A1 cannot be less than zero; A2 is generally equal to or greater than 1.10, and equal to or less than 2.00; A3 is generally equal to or greater than 0.00, and equal to or less than 1.20; A4 is generally equal to or greater than 0.90, and equal to or less than 2.50; and A5 is generally equal to or greater than 0.40, and equal to or less than 0.80. These constraints, like the variables themselves, are selected to model the behavior of available absorber materials. They may be changed from these suggested values at the user's discretion.

As stated previously, it is feasible in accordance with the invention to optimize backing layers 10 of FIG. 1 using fixed material properties, rather than generally defining the layers by way of the variables A1–A5 and their and their constraints. In this case the above mentioned parameterization stage of the method substitutes the measured properties of the absorber materials being considered by the wall designer for the above mentioned variables.

Figure 8B:
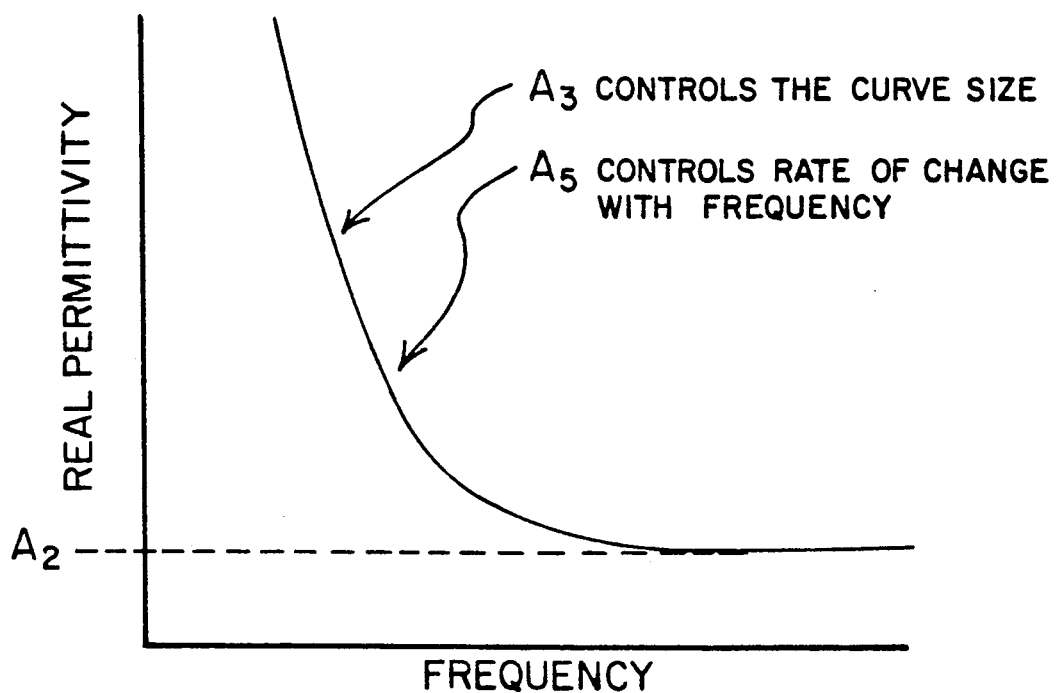
FIGS. 8B and 8C show exemplary curves of the real permittivity and the imaginary permittivity, respectively, of an exemplary backing layer of FIG. 1, as the shape of these curves are determined by the user defined variables A2-A5.
Figure 8C:
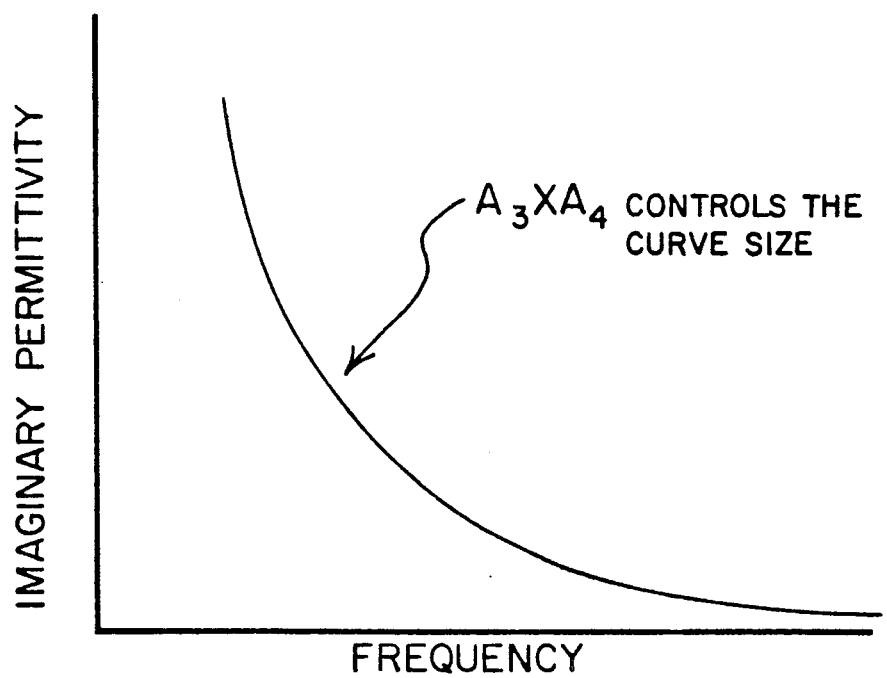

The general effect of variables A2–A5 is shown in FIGS. 8B and 8C, which figures are exemplary curves of the real permittivity and the imaginary permittivity, respectively, of an exemplary layer within composite layer 10.

Use of variables A2–A5 allows considerable flexibility to the wall designer in the modelling of permittivities and conductivities of actual layer materials.

Other user-defined parameters are required by the objective function of FIG. 6, prior to start of the minimization process or method of the invention, i.e. block 71 of FIG. 7.

As shown in FIG. 7, these include (1) a list of the incident wave sampling angles for both E and M wave polarization, (2) a list of the wave sampling frequencies, (3) the order of the norms for the objective function, (4) the number of backing layers within composite layer 10, (5) the upper and lower constraints on the total Z direction length of composite layer 10, and (6) the objective function's scale factor.

In addition, should the designer elect to only generally define the wave dispersion characteristics of layers 10, then in addition to the above items, the user defined parameters stored in memory means 72 of FIG. 7 must include (7) the four above mentioned variables A2–A5, including the initial value and the upper and lower bounds of these four variables.

Figure 9:
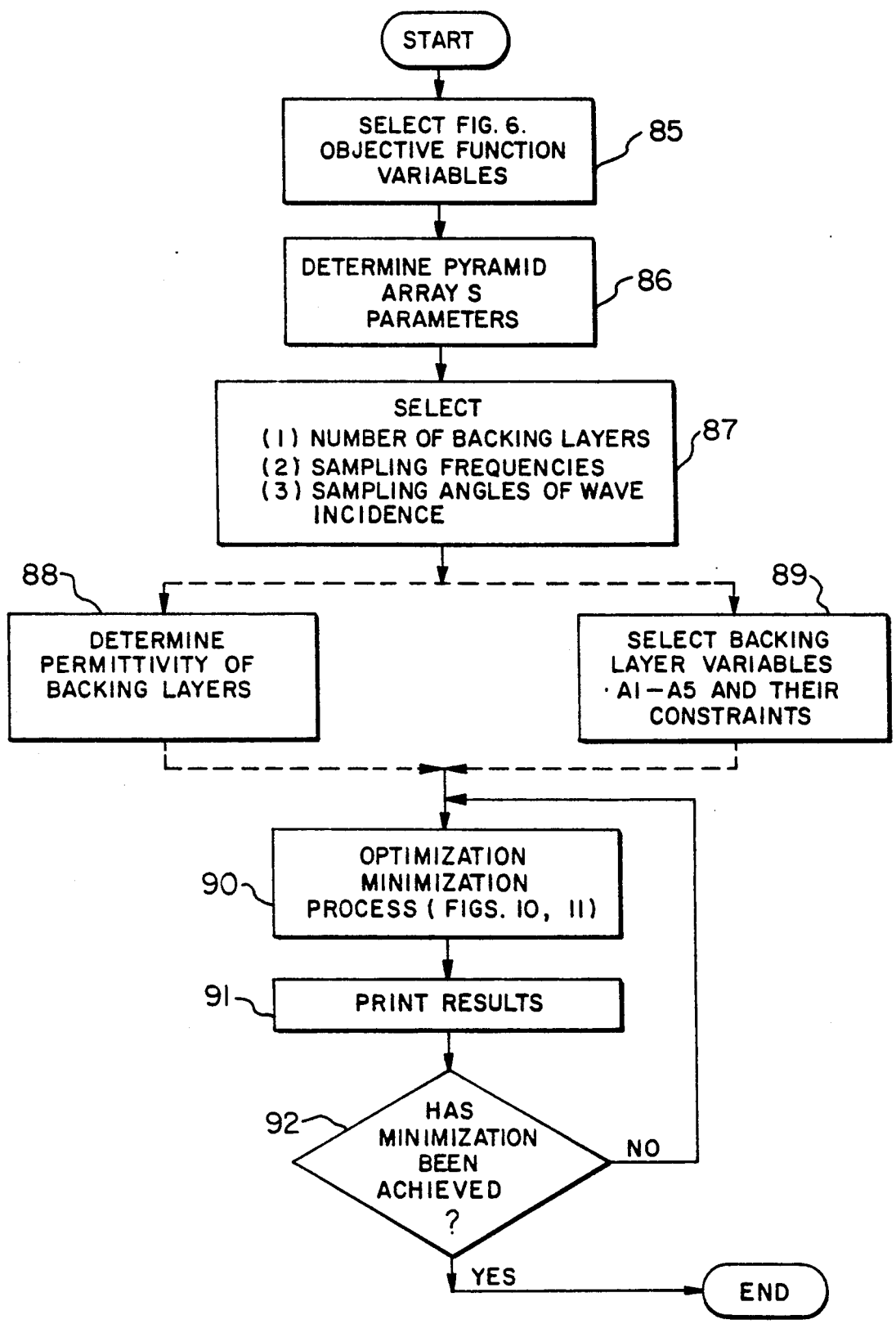
FIG. 9 shows a preferred embodiment of the invention in block diagram form.
Figure 10:
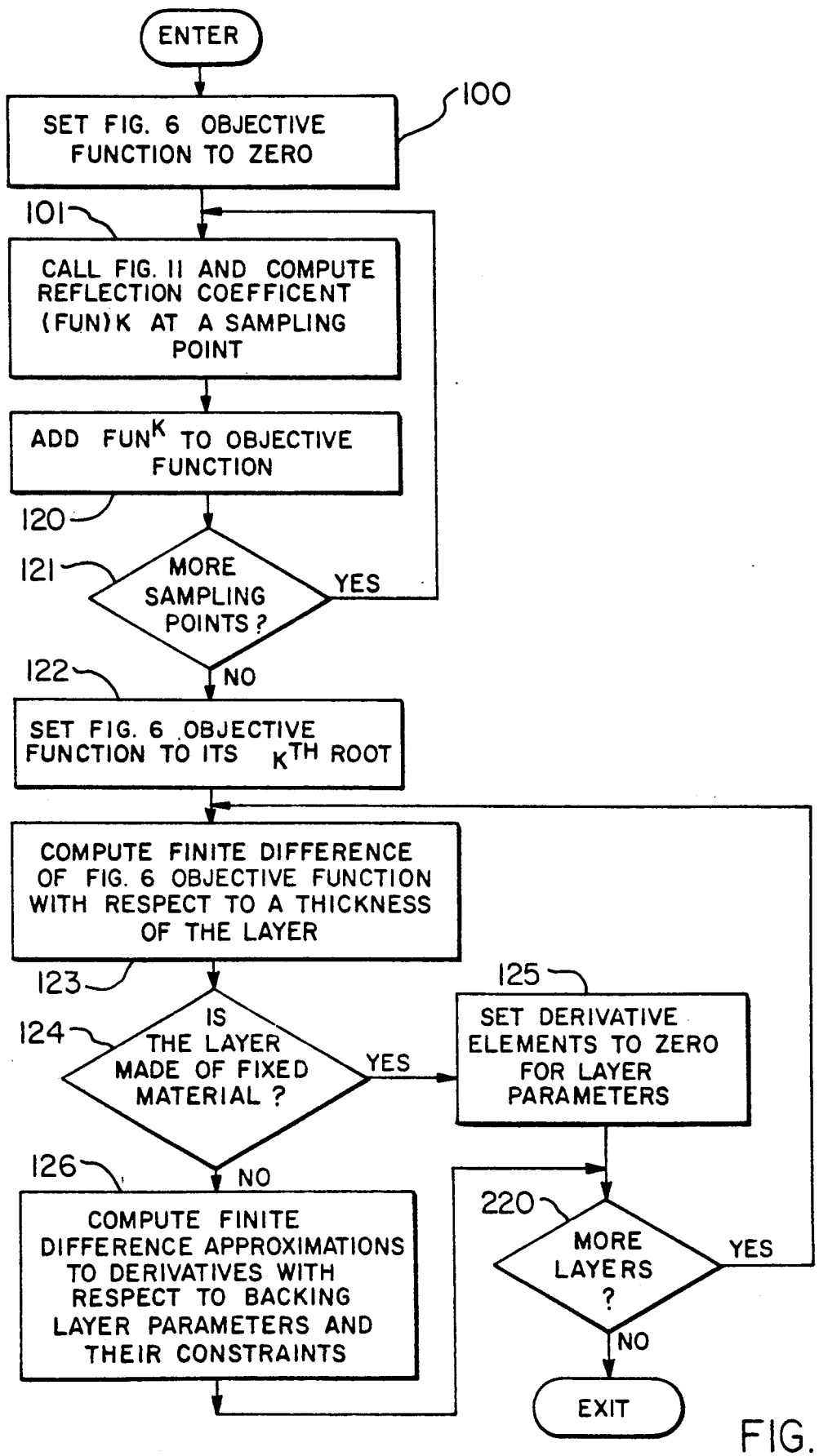
FIGS. 10 and 11 show the method steps that comprise the optimization minimization process step of FIG. 9.
Figure 11:
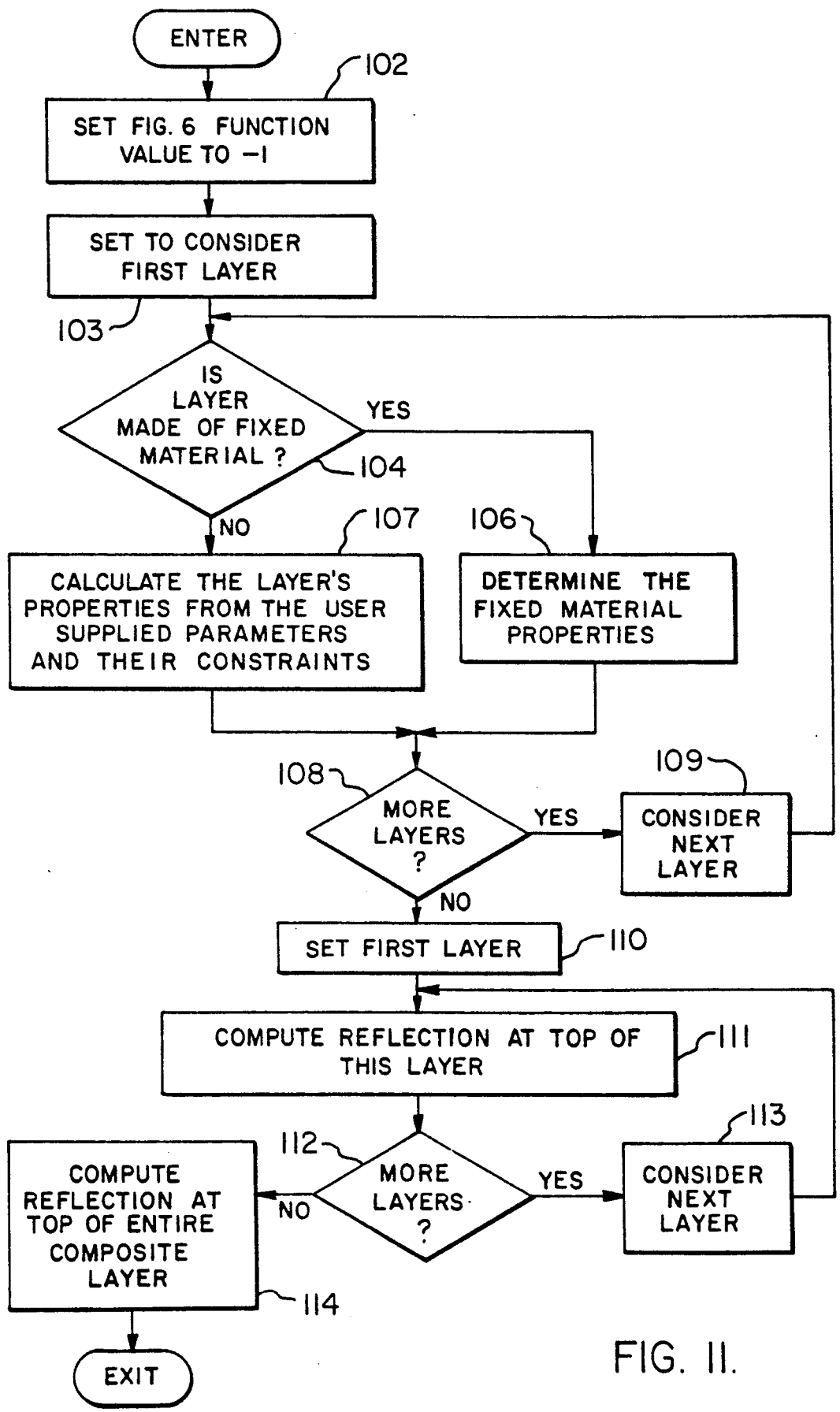

FIG. 9 discloses a preferred embodiment of the invention in block diagram form, and FIGS. 10 and 11 show the method steps that comprise optimization/minimization process step 90 of FIG. 9.

With reference to FIG. 9, the method of the invention begins at step or block 85 whereat the variables for FIG. 6's objective function are selected or defined by the wall designer or user. These variables comprise wave frequency sampling points, wave incident sampling points, the scale factor of the function, and the order, norm or power of the function.

At block 86, the S parameters of pyramid array 11 of FIG. 1 are determined or defined.

At block 87 the user defines the number of backing layers that are to comprise FIG. 1's composite backing layer 10.

As will be remembered, the material from which the individual layers within composite layer 10 are to be formed can be defined as known or fixed material, or, the individual layers can be defined by way of material variables A1–A5 and constraints that are placed thereon. Block 88 shows the former method step of the invention, whereas block 89 shows the alternative later method step of the invention.

When the above steps have been completed, the optimization/minimization step 90 of the invention begins, by the use of an optimization function or algorithm. FIG. 6 shows such an optimization function. Other such optimizations functions are described in *Practical Optimization*, by P. E. Gill, W. Murray and M. H. Wright (London: Academic Press, 1981), incorporated herein by reference, or may be as is described in other sources well known to those skilled in the art. Commercially available implementations of these optimization algorithms are provided by several sources. All such implementations will require a separate subprogram that evaluates the function to be minimized. The invention makes use of an objective function which appropriately weights the reflections at the various frequency and incident angle sampling points, for example the function shown in FIG. 6. The method of evaluating this function is shown in FIGS. 10 and 11, to be described below.

After each optimization cycle of FIGS. 10–11, the minimization results are printed at block 91, and a test for a minimum condition is made at block 92 based on how little the parameters have changed from the last optimization cycle, as well as an error code reported by the optimization routine, which may require the optimization to be restatted from the current test point. If a minimum condition has not been reached, block 90 is again activated. If a minimum condition has been reached, the method ends, and the data printed by block 91 is utilized as the optimized, minimized wave reflection output which determines the best composite backing layer 10 construction to use for the pyramid array 11 whose S parameters were defined in method block 86.

With reference to FIGS. 10–11, these figures show the detailed steps that comprise method block 90 of FIG. 9.

The method steps of FIG. 9 begin at block 100 by initializing the FIG. 6 objective function equal to the value zero. The next method block 101 calls the method steps of FIG. 10.

With reference to FIG. 10, method block 102 now sets the reflection coefficient equal to the value minus 1, and block 103 operates to prepare the method to first consider the first backing layer, i.e. the layer that is adjacent to the chamber wall and is the most distant from pyramid array 11.

Method block 104 now operates to determine if the backing layer is defined as being of a fixed material or if the layer is defined by way of its variables A2–A5. Blocks 106 or 107 are enabled accordingly.

Block 108 now determines if all of the individual layers within composite layer 10 have been considered. If not, block 109 operates to cause block 104 to consider the next adjacent layer. If all layers have been considered, block 110 operates to again prepare the method to consider the first backing layer.

Method block 111 now operates to compute the wave reflection that occurs from the top of the layer being considered, that is from the surface of the layer that is the closest to pyramid array 11.

After this reflection has been computed, block 112 determines if all of the individual layers within composite layer 10 have been considered. If not, block 113 operates to cause block 111 to compute the wave reflection that occurs from the top of the next adjacent layer. If all layers have been considered, block 114 operates to compute the wave reflection that occurs from the top of composite layer 10 of FIG. 1 (defined herein as FUN).

The FUN computation result of block 114 of FIG. 11 is now received by method block 120 of FIG. 10, and the Kth power of FUN is added to the objective function of FIG. 6, whereupon block 121 determines if all wave frequency/incident angle sampling points have been computed. If not, block 101 and FIG. 11 are repeated for a different sampling point. If all sampling points have been computed, method block 122 operates to set the objective function of FIG. 6 to its Kth root.

Method block 123 now operates to compute the finite difference approximation to the derivative of the FIG. 6 objective function with respect to a thickness of composite layer 10 of FIG. 1, whereupon block 124 operates to determine if the layer is defined as being of a fixed material or if the layer is defined by way of its variables A1–A5. Blocks 125 or 126 are enabled accordingly.

Method block 127 determines if all of the individual layers within composite layer 10 have been considered. If not, block 123 is enabled to estimate the derivatives of the objective function with respect to the variables associated with the next layer. If all layers have been considered, block 114 terminates the evaluation of the objective function and its derivatives, and control returns to the optimization subroutine which uses this information to compute the next estimate of the location of the minimum point.

The process of computing the FIG. 6 objective function, its derivatives and a new estimate of the optimized solution continues until one of the following conditions obtains: (i) the minimum is found, (ii) the maximum numbers of allowed iterations is reached, or (iii) no further progress toward the solution can be made. The optimization subroutine reports the final point and the success or failure condition of the search. Control then returns to block 91 which prints the results.

This output defines the number of backing layers to be used within FIG. 1's composite layer 10, their physical dimensions and their material properties, so as not to modify the high frequency behavior of pyramid array 10, while at the same time providing reduced low frequency wave reflection from absorbing wall 10,11.

The invention has been described with reference to various embodiments. Since it is apparent that those skilled in the art will readily visualize yet other embodiments that are within the spirit and scope of the invention, it is intended that the invention be as defined in the claims hereof.

What is claimed is:

1. A method for constructing an electromagnetic wave absorbing wall covering for an anechoic measurement chamber, the wall covering comprising a pyramid cone array having specified S parameter characteristics, said pyramid array being mounted on a plurality of backing layers, and the physical dimensions and material properties of said plurality of backing layers being variable, comprising the steps of;

(A) determining said specified S parameter characteristics of said pyramid array,
(B) determining variable thickness, conductivity and permittivity parameters of each individual one of said backing layers,
(C) providing a mathematical objective function which defines low frequency wave reflection from said wall covering as a function of said specified S parameters and said variable thickness, conductivity and permittivity parameters of said backing layers,
(D) providing optimization criteria to said objective function,
(E) optimizing said objective function to define a backing layer construction that produces minimum weighted low-frequency wave reflection from said wall covering, and
(F) constructing an electromagnetic wave absorbing wall having a pyramid cone array of said specified S parameters and a plurality of backing layers having said defined construction of step (E), said method operating to select physical dimensions and material properties for said backing layers in a manner so as to not modify high-frequency wave reflection characteristics of said pyramid array, while at the same time providing reduced low-frequency wave reflection from said wall covering.

2. The method of claim 1 wherein said step (E) optimizes said objective function at a number of wave incident angles and wave frequencies.

3. The method of claim 2 wherein said step (B) includes the alternative steps of;

(B1) determining the thickness, conductivity and permittivity parameters of each individual one of said backing layers wherein said layers are composed of fixed materials, or
(B2) determining the thickness, conductivity and permittivity parameters of each individual one of said backing layers wherein said layers are composed of theoretical materials having constraints upon the variation that is allowed in said thickness, conductivity and permittivity parameters.

4. The method of claim 3 wherein said step (B2) includes the step of;

(B3) mathematically defining said permittivity parameter as a function of real and imaginary components thereof, and wherein said constraints comprise variables of said mathematically defined permittivity parameter.

5. The method of claim 1 wherein said step (B) includes the alternative steps of;

(B1) determining the thickness, conductivity and permittivity parameters of each individual one of said backing layers wherein said layers are composed of fixed materials, or
(B2) determining the thickness, conductivity and permittivity parameters of each individual one of said backing layers wherein said layers are composed of theoretical materials having constraints upon the variation that is allowed in said thickness, conductivity and permittivity parameters.

6. The method of claim 5 wherein said step (B2) includes the step of;

(B3) mathematically defining said permittivity parameter as a function of real and imaginary components thereof, and wherein said constraints comprise variables of said mathematically defined permittivity parameter.

* * * * *